Figure 1:
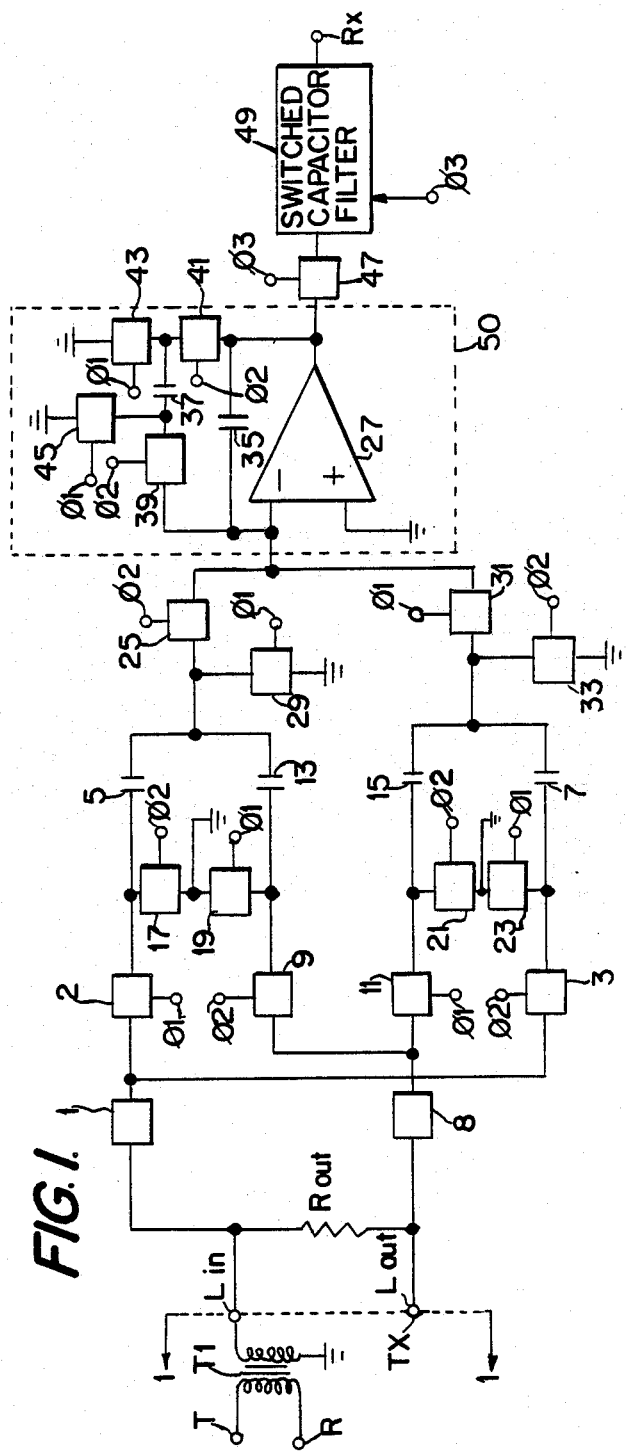

United States Patent [19]

Colbeck et al.

[11] Patent Number: 4,653,017

[45] Date of Patent: Mar. 24, 1987

[54] DECIMATING FILTER

[75] Inventors: Roger Colbeck; Peter Gillingham, both of Ottawa, Canada

[73] Assignee: Mitel Corporation, Kanata, Canada

[21] Appl. No.: 783,554

[22] Filed: Oct. 3, 1985

[30] Foreign Application Priority Data

May 27, 1985 [CA] Canada .................................. 482496

[51] Int. Cl.[4] .............................................. G06G 7/00
[52] U.S. Cl. ...................................... 364/825; 364/724
[58] Field of Search ........ 364/807, 825, 829, 839–840, 364/724, 733, 602, 605; 333/19, 165–167, 172–173

[56] References Cited

U.S. PATENT DOCUMENTS

| 4,344,149 | 8/1982 | van de Meeberg et al. | 364/724 |
| 4,354,169 | 10/1982 | Nossek | 333/173 |
| 4,356,464 | 10/1982 | Fettweis | 333/173 |
| 4,455,539 | 6/1984 | Wurzburg | 333/173 |
| 4,584,659 | 4/1986 | Stikvoort | 364/724 |

OTHER PUBLICATIONS

R. Gregorian, "Filtering Techniques With Switched-Capacitor Circuits", *Microelectronics Journal*, vol. 11, No. 2, Mar.-Apr.-1980, pp. 13–21.
C. Rahim et al., "A Functional MOS Circuit for Achieving the Bilinear Transformation in Switched Capacitor Filters", *IEEE Journal of Solid-State Circuits*, vol. SC-13, No. 6, Dec. 1978, pp. 906–909.
R. Gregorian et al., "MOS Sampled-Data High-Pass Filters Using Switched-Capacitor Integrators", *Microelectronics Journal*, vol. 11, No. 2, Mar.-Apr. 1980, pp. 22–25.
Roubik Gregorian et al. article reprinted from *IEEE Trans. Circuits Syst.*, vol. CAS-27, pp. 509–514, Jun. 1980; "Switched Capacitor Decimation and Interpolation Circuits".
Von Grunigen et al. Article of *IEEE Journal of Solid-State Circuits*, vol. SC-17, No. 6, Dec. 1982, pp. 1024–1028; "Integrated Switched-Capacitor Low-Pass Filter with Combined Anti-Aliasing Decimation Filter for Low Frequencies".

*Primary Examiner*—Gary V. Harkcom
*Attorney, Agent, or Firm*—Sandler & Greenblum

[57] ABSTRACT

A decimating filter utilizing first and second switched input capacitors for sampling an input signal on opposite phases of a first sampling clock signal. The switched input capacitors are connected to an integrating circuit for filtering the sampling signal. An output of the integrating circuit is sampled according to a second sampling clock signal having a frequency equal to a submultiple of the first sampling clock signal frequency. By sampling the input signal on opposite phases, the input signal is effectively sampled at twice the first sampling clock signal frequency. Accordingly, in applications involving high sampling frequencies, such as digital signal transmission, the input signal can be sampled at a sufficiently high frequency without requiring a prohibitively high input sampling clock frequency. The decimating filter is of simple design and can be inexpensively implemented on an integrated circuit chip requiring small area.

22 Claims, 2 Drawing Figures

DECIMATING FILTER

The invention relates in general to filters, and in particular to switched-capacitor decimating filters.

It is well known that input signals applied to sampled data systems, such as switched-capacitor filters, require band-limiting in order to prevent aliasing. Typically, anti-aliasing prefilters are connected to an input stage of the switched-capacitor filter. For a low-pass switched-capacitor filter operating at a predetermined sampling frequency and exhibiting a predetermined cut-off frequency, the anti-aliasing filter is required to band-limit input signals to frequencies not greater than the predetermined sampling frequency minus the predetermined cut-off frequency.

Prior art analog anti-aliasing filters are typically in the form of active RC filters fabricated in conjunction with the switched-capacitor filter on an integrated circuit chip. The RC filters are typically implemented in polysilicon or diffusion layers of the chip such that inaccuracies in the fabrication process typically result in large tolerances which degrade filter performance.

One prior art alternative anti-aliasing filter utilizes external or post trimmed RC filters. This alternative suffers from the disadvantage that the cost of an external RC filter may exceed that of the switched-capacitor filter, and furthermore, monolithic active RC filters typically exhibit a relatively high pole frequency due to technological limitations imposed on the tolerances of capacitor and resistor values.

A second prior art alternative to expensive anti-aliasing filters is to increase the sampling frequency of the switched-capacitor filter. Accordingly, the anti-aliasing filter pass band is considerably enlarged, resulting in less stringent analog filter requirements such that inexpensive, easily fabricated RC anti-aliasing filters can be used. However, increasing the sampling frequency of the switched-capacitor filter generally increases the spread of capacitance values among the various capacitors as well as increasing sensitivity of filter response to parasitic capacitances and design tolerances, resulting in deterioration of filter sensitivity.

A further alternative is to increase the sampling frequency on an input stage of the switched-capacitor filter subsequent to filtering via an inexpensive analog anti-aliasing filter. This alternative is known in the art as decimation.

By sampling a band-limited input signal at a first frequency equal to an integer multiple of the switched-capacitor sampling frequency, transfer function zeroes appear in the amplitude response of the switched-capacitor filter at submultiples of the first frequency. Hence, the preceeding analog anti-aliasing filter is required to band-limit the input signal only to frequencies less than the first frequency minus the switched-capacitor cut-off frequency.

One such decimation technique is described in an article entitled SWITCHED-CAPACITOR DECIMATION AND INTERPOLATION CIRCUITS, by Roubik Gregorian and William E. Nicholson, published in the IEEE Transactions on Circuits and Systems, Vol., CAS-27, No. 6, June 1980, pages 509-514. According to the Gregorian technique, an input signal is sampled at twice the switched-capacitor sampling frequency. Decimation is performed and accordingly, the input analog anti-aliasing filter is required to band-limit the input signal to a frequency of only twice the sampling frequency minus the switched-capacitor cut-off frequency.

However, the Gregorian circuit exhibits numerous stray capacitances due to interconnections on the integrated circuit. These stray capacitances result in finite attenuation of input signal frequencies at the sampling frequency. As discussed above, it is desired that the filter transfer function exhibits a zero at the sampling frequency, (i.e. infinite attenuation), otherwise aliasing will typically occur.

Another decimation technique is disclosed in an article entitled INTEGRATED SWITCHED-CAPACITOR LOW-PASS FILTER WITH COMBINED ANTI-ALIASING DECIMATION FILTER FOR LOW FREQUENCIES, by Daniel C. von Grunigen et al, which appeared in the IEEE Journal of Solid-State Circuits, vol., SC-17, No. 6, December 1982, page 1024.

The circuit of von Grunigen et al overcomes the disadvantages of stray capacitance in the Gregorian circuit, yet requires complex timing generation in order to sample an input signal at a multiple of the filter sampling rate.

Also, it has been found that while the circuit of von Grunigen et al is suitable for systems with low input signal frequencies (e.g. bio-electronic systems), it is unsuitable for systems with high input signal frequencies, such as digital signal transmission systems. For example, in a typical digital signal transmission system having a 2.56 MHz transmission rate and switched-capacitor implementation, approximately 200 nanoseconds are allotted per sample for charging the capacitors and allowing internal operational amplifiers to settle to a final output level. Design constraints of the internal capacitors and operational amplifiers generally prohibit sampling of the input signal at much greater than 2.56 MHz.

According to the present invention, an input signal to be applied to a sampled data system (such as a switched-capacitor filter) is initially filtered in a simple RC analog anti-aliasing low pass filter in a well known manner and then sampled on both phases of a sampling clock signal. By sampling the input signal on both phases of the sampling clock signal, the signal is effectively sampled at twice the frequency of the sampling clock signal, resulting in decimation. The input signal samples are integrated, filtered and sampled again at the frequency of the sampled data system, which is typically equal to approximately one-half the frequency of the sampling clock signal.

Hence, according to the present invention a decimating filter is provided which overcomes the disadvantages of prior art anti-aliasing techniques requiring high sampling frequencies or expensive analog anti-aliasing filters, yet is useful for systems requiring a high sampling frequency, such as digital signal transmission systems. Also, the present invention incorporates design features for eliminating stray capacitances, yet requires no complex timing circuitry as in the circuit of von Grunigen et al.

In general, the invention is a decimating filter comprised of an input for receiving a first input signal, and a circuit for generating first and second clock signals having first and second sampling frequencies respectively, the first frequency being a multiple of the second frequency. The invention is further comprised of a first switched-capacitor circuit for receiving the first clock signal, sampling the received input signal on a first phase of the first clock signal and generating a first sample signal in response thereto, and a second switched-capacitor circuit for receiving the first clock signal, sampling the received input signal on an opposite phase of the first clock signal and generating a second sampled signal in response thereto, whereby the input signal is effectively sampled at twice the first sampling frequency as a result of being sampled on opposite phases of the first clock signal. In addition, the invention includes an integrator circuit for receiving the second clock signal, integrating the first and second sampled signals, sampling the integrated signals at the second sampling frequency and generating a filtered output signal in response thereto.

The invention is also a decimating filter, comprised of a first input for receiving a first input signal, a second input for receiving a second input signal including a reduced version of the first input signal, and a circuit for generating first and second clock signals having first and second sampling frequencies respectively, the first frequency being a multiple of the second frequency. The invention is further comprised of a first switched-capacitor for receiving the first clock signal, sampling the first input signal on a first phase of the first clock signal and generating a first sampled signal in response thereto, a second switched-capacitor for receiving the first clock signal, sampling the first input signal on an opposite phase of the first clock signal and generating a second sampled signal in response thereto, a third switched-capacitor for receiving the first clock signal, sampling the second input signal on the first phase of the first clock signal, and generating a third sampled signal in response thereto, and a fourth switched-capacitor for receiving the first clock signal, sampling the second input signal on the opposite phase of the first clock signal, and generating a fourth sampled signal in response thereto. In addition, the invention is comprised of circuitry for subtracting the third and fourth sampled signals from the first and second sampled signals, whereby the reduced versions of the first input signal are substantially cancelled from the second input signal, and an integrator for receiving the second clock signal, integrating the subtracting signals, sampling the integrated signals at the second sampling frequency and generating a decimated filtered output signal in response thereto.

Figure 2:
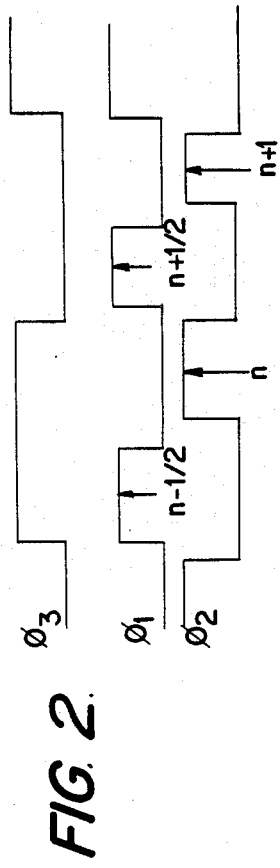

A better understanding of the invention will be obtained by reference to the detailed description below, in conjunction with the following drawings in which:

FIG. 1 is a schematic diagram of a decimating filter according to a preferred embodiment of the invention, and FIG. 2 is a timing diagram of sampling clock signals according to the preferred embodiment.

With reference to FIG. 1, a switched-capacitor decimating filter is shown connected via line input and output terminals $L_{IN}$ and $L_{OUT}$ to a transformer T1 connected to a balanced line, such as a tip and ring lead pair, T and R. The portion of the schematic diagram designated by dashed line 1—1 does not form part of the present invention but is the environment in which the invention typically operates. A transmit terminal $T_x$ is connected to the $L_{OUT}$ terminal and via an output resistor $R_{OUT}$ to the transformer T1 and the $L_{IN}$ terminal.

As discussed in greater detail below, signals appearing on the $L_{IN}$ terminal are predominantly comprised of signals originating from a remote signal source (i.e. a subscriber set) and carried by the tip and ring lead pair, T and R, yet may be partially comprised of reduced versions of near end signals originating on the $T_x$ terminal and transmitted through the output resistor, $R_{OUT}$.

An incoming signal received on the $L_{IN}$ terminal is filtered by a simple RC anti-aliasing filter 1 in a well known manner and then applied via transistor switches 2 and 3 to first terminals of capacitors 5 and 7 respectively. Similarly, a signal received on the $L_{OUT}$ terminal is filtered by a further simple RC anti-aliasing filter 8 and then applied via transistor switches 9 and 11 to first terminals of capacitors 13 and 15 respectively. The first terminals of capacitors 5, 13, 15 and 17 are connected to ground via transistor switches 17, 19, 21 and 23 respectively.

In a successful prototype of the invention, capacitors 5 and 7 were of twice the capacitance of capacitors 13 and 15 in order to perform rudimentary echo signal cancellation of output signals from the $T_x$ terminal appearing on the $L_{IN}$ terminal as described in greater detail below.

Second terminals of capacitors 5 and 13 are connected together and via transistor switch 25 to an inverting input of an operational amplifier 27, and also to ground via transistor switch 29. Likewise, second terminals of capacitors 7 and 15 are connected together and to the inverting input of operational amplifier 27 via transistor switch 31, and to ground via transistor switch 33.

An integrating capacitor 35 is connected to an output of operational amplifier 27 and to the inverting input thereof, and the non-inverting input of amplifier 27 is connected to ground. A feedback capacitor 37 is connected in parallel with integrating capacitor 35, via transistor switches 39 and 41 to the inverting input and the output respectively of operational amplifier 27, and to ground via transistor switches 43 and 45.

The output of operational amplifier 27 is connected via transistor switch 47 to a switched-capacitor filter 49 of well known design having a signal output terminal RX and a clock input for receiving a clock signal $\phi 3$. The switched-capacitor filter 49 can alternatively be any sampled data system for which anti-aliasing prefiltering is required.

Each of the aforementioned transistor switches has a control input thereof for receiving one of clock signals $\phi 1$, $\phi 2$ or $\phi 3$ as illustrated. The transistor switches are typically in the form of CMOS transmission gates, comprised of a pair of NMOS and PMOS transistors operated under control of clock signals $\phi 1$, $\phi 2$ or $\phi 3$. Logic compliment or inverted versions of the $\phi 1$, $\phi 2$ and $\phi 3$ signals are also applied to further control inputs of the corresponding aforementioned transmission gates but are not illustrated for ease of description.

Considering operation of the circuit with reference to signals on the $L_{IN}$ terminal and filtered by filter 1, (momentarily disregarding signals on the $L_{OUT}$ terminal), capacitor 5 charges to the instantaneous voltage level of a signal on the $L_{IN}$ terminal filtered by filter 1, via transistor switches 2 and 29 in response to a positive half cycle of clock signal $\phi 1$, as shown in FIG. 2. Simultaneously, capacitor 7 is discharged to ground via switch 23, and a charge similar to that discharged from capacitor 7, but with opposite polarity, is induced across integrating capacitor 35 via transistor switch 31.

In response to a subsequent positive half cycle of the $\phi 2$ clock signal, capacitor 7 is charged to the voltage level of the signal then appearing on the $L_{IN}$ terminal filtered in filter 1, via switches 3 and 33. Capacitor 5 is simultaneously discharged via switch 17 such that a similar but opposite polarity charge is induced across integrating capacitor 35 in parallel with feedback capacitor 37, via switches 25, 39 and 41.

The voltage appearing across integrating capacitor 35 and at the output of integrator 50 is designated as "$V_{OUT},n$", and is represented by the following relation:

$$V_{OUT},n = [V_{OUT},n-\tfrac{1}{2}] - [AV_{OUT},n] - [BV_{IN},n]$$

where "$V_{OUT},n-\tfrac{1}{2}$" designates the voltage across integrating capacitor 35 at a time "$n-\tfrac{1}{2}$" shown in FIG. 2, "A" designates the ratio of capacitance of feedback capacitor 37 to integrating capacitor 35, "B" designates the ratio of capacitance of capacitor 5 (or 7) to integrating capacitor 35, and the term "$V_{IN},n$" designates the instantaneous voltage on the $L_{IN}$ terminal at time "n".

The above mentioned relation can be expressed in the sampled frequency domain as follows:

$$V_{OUT} = V_{OUT}z^{-\tfrac{1}{2}} - AV_{OUT} - BV_{IN}$$

where the term "$z^{-\tfrac{1}{2}}$" designates a one-half sample delay of the $\phi 1$ (or $\phi 2$) clock signal.

During a subsequent positive half cycle of the $\phi 1$ clock signal (i.e. "$n+\tfrac{1}{2}$" in FIG. 2), capacitor 5 is again charged to the instantaneous voltage on the $L_{IN}$ terminal filtered by filter 1. Also, capacitor 7 is discharged such that a similar but opposite polarity charge is induced across integrating capacitor 35, capacitor 37 being disconnected therefrom via switches 39 and 41 and discharged via switches 43 and 45.

The voltage across integrating capacitor 35, and hence the output voltage of integrator 50 can be designated at time "$n+\tfrac{1}{2}$" as follows:

$$V_{OUT},n+\tfrac{1}{2} = [V_{OUT},n] - [BV_{IN},n+\tfrac{1}{2}]$$

which can be transformed to a sampled frequency domain relation as follows:

$$V_{OUT}z^{-\tfrac{1}{2}} = V_{OUT}z^{-1} - BV_{IN}z^{-\tfrac{1}{2}}$$

It will be noted that the feedback term "$AV_{OUT}$" has been eliminated in relation to the previous sampled frequency domain relation with respect to samples taken at time "n". This is due to capacitor 37 being discharged and thereby disconnected from the circuit. Thus, it can be seen that no filtering function is performed during positive half cycles of the $\phi 1$ clock signal.

The first frequency relation can be algebraically manipulated to yield a transfer function, as follows:

$$H(z) = \frac{Bz + Bz^{\tfrac{1}{2}}}{(1+A)z - 1} = \frac{(1 + z^{-\tfrac{1}{2}})Bz}{(1+A)z - 1}$$

where the term "$1 + z^{-\tfrac{1}{2}}$" represents a decimation transfer function, and the term $$\frac{Bz + Bz^{\tfrac{1}{2}}}{(1+A)z - 1}$$

represents a well known low-pass filter transfer function.

The output of integrator 50 is sampled via switch 47 during positive half cycles of the $\phi 3$ clock signal, shown in FIG. 2, in order to conform to the $\phi 3$ clock signal sampling frequency of the switched capacitor filter 49 and additional circuitry (such as D/A converters, RAM, etc.) which may be connected to the RX terminal.

Operational amplifier 27, in conjunction with capacitors 35 and 37 exhibits a predetermined settling time such that during a positive half cycle of the $\phi 3$ clock signal the output of integrator 50 settles to a quiescent level at a predetermined instant of time within the positive half cycle of the $\phi 2$ signal. The output of integrator 50 is effectively sampled via switch 47 when it reaches the quiescent level.

Both decimation and filtering are performed according to the present circuit whereby the input signal on the $L_{IN}$ terminal is effectively sampled twice (i.e. at times $n-\tfrac{1}{2}$ and n in FIG. 2) for each half-cycle of the $\phi 1$ (or $\phi 2$) clock signal, resulting in decimation by two, yet requiring only the $\phi 1$ and $\phi 2$ clock signals and no additional higher frequency clock signal, as in the prior art device of von Grunigen et al. Filters 1 and 8 are required to band-limit the input signal only to frequencies less than the frequency of the $\phi 1$ (or $\phi 2$) clock signal minus the cut-off frequency of switched-capacitor filter 49. Thus, filters 1 and 8 are preferably simple inexpensive RC anti-aliasing filters.

Considering operation of capacitors 13 and 15, capacitor 13 is discharged via switches 19 and 29, and capacitor 15 is charged to the instantaneous voltage level of a signal on the $L_{OUT}$ terminal filtered in filter 8, via transistor switch 11 during a positive half cycle of the $\phi 1$ clock signal. A similar charge of like polarity is developed across integrating capacitor 35 via switch 31.

In response to a positive half cycle of the $\phi 2$ clock signal, capacitor 13 charges to the voltage level on the $L_{OUT}$ terminal filtered by filter 8, via switch 9, and a similar charge develops across capacitor 35 via switch 25, while capacitor 15 is discharged via switches 21 and 33.

Due to the phase relationship of the various switching transistors and the $\phi 1$ and $\phi 2$ clock signals, it is seen that samples of the signal on the $L_{IN}$ terminal are stored on capacitors 5 and 7, and charge is negatively transferred to integrator 50 whereas samples of the signal on the $L_{OUT}$ terminal are stored on capacitors 13 and 15, and charge is positively transferred to integrator 50. Thus, capacitors 5 and 7 function effectively as negative resistances, whereas capacitors 13 and 15 function as positive resistances.

A well known problem in signal transmission along balanced lines, (such as tip and ring lead pairs T and R), is the phenomenon of transhybrid loss, wherein a reduced version of a transmitted output signal on the $T_x$ terminal appears on the $L_{IN}$ terminal. In particular, the amplitude of the output signal appearing on the $L_{IN}$ terminal is equal to approximately one-half the amplitude of the original output signal on the $T_x$ terminal, due to voltage drop across the output resistor $R_{OUT}$.

As discussed above, capacitors 5 and 7 are preferably of twice the capacitance of capacitors 13 and 15. Hence, capacitors 5 and 7 function as negative resistances having effective resistances equal to approximately one-half the effective resistances of capacitors 13 and 15 (which function as positive resistances). Accordingly, near-end echo or transhybrid loss of the output signal appearing on the $L_{IN}$ terminal is effectively cancelled at the inverting input of operational amplifier 27, which acts as a summing node.

Thus, by substantially eliminating near-end signal, rudimentary echo cancellation is performed, thereby improving the dynamic range of a signal carried by on the tip and ring leads, T and R, and received on the $L_{IN}$ terminal (FIG. 1).

A person skilled in the art understanding this invention may now conceive of other embodiments or variations using the principles described herein.

For example, switches 25 and 39, and 29 and 45 perform substantially the same function. Thus, switches 39 and 45 can be omitted and the first terminal of capacitor 37 can be connected to the node connecting the second terminals of capacitors 5 and 13.

Also, whereas the invention has been described in relation to a decimating filter having differential inputs ($L_{IN}$ and $L_{OUT}$) for performing rudimentary echo cancellation, it is also useful for other applications, such as a simple decimating filter having one input, (for instance $L_{IN}$) and comprised of two input capacitors and associated switches (for instance capacitors 5 and 13, and switches 1, 9, 17, 19, 25 and 29).

All these and other variations are considered to be within the sphere and scope of this invention, as defined in the claims appended hereto.

We claim:

1. A decimating filter, comprised of:
   (a) input means for receiving an input signal,
   (b) means for generating first and second clock signals having first and second sampling frequencies respectively, said first frequency being a multiple of said second frequency,
   (c) first switched-capacitor means for receiving said first clock signal, sampling said received input signal on a first phase of said first clock signal and generating a first sampled signal in response thereto,
   (d) second switched-capacitor means for receiving said first clock signal, sampling said received input signal on an opposite phase of said first clock signal and generating a second sampled signal in response thereto,
   whereby said input signal is effectively sampled at twice said first sampling frequency as a result of being sampled on opposite phases of said first clock signal, and
   (e) integrator means for receiving said second clock signal, integrating said first and second sampled signals, sampling said integrated signals at said second sampling frequency and generating a decimated filtered output signal in response thereto.

2. A decimating filter as defined in claim 1, wherein said first clock signal is comprised of first and second non-overlapping rectangular signals.

3. A decimating filter as defined in claim 2, wherein said first switched-capacitor means is comprised of:
   (a) a first capacitor having first and second terminals,
   (b) first transistor switch means for receiving said non-overlapping signals and alternately connecting said first terminal of the capacitor between said input means and ground in response to positive half cycles of said first and second non-overlapping signals respectively, and
   (c) second transistor switch means for receiving said non-overlapping signals and alternately connecting said second terminal of the capacitor between ground and an input of said integrator means in response to said positive half cycles of the first and second non-overlapping signals respectively.

4. A decimating filter as defined in claim 3, wherein said second switched-capacitor means is comprised of:
   (a) a second capacitor having first and second terminals,
   (b) third transistor switch means for receiving said non-overlapping signals and alternately connecting said first terminal of the second capacitor between ground and said input means in response to said positive half cycles of the first and second non-overlapping signals respectively, and
   (c) fourth transistor switch means for receiving said non-overlapping signals and alternately connecting said second terminal of the second capacitor between said input of the integrator means and ground in response to said positive half cycles of the first and second non-overlapping clock signals.

5. A decimating filter as defined in claim 4, wherein each of said transistor switch means is comprised of a pair of CMOS transmission gates.

6. A decimating filter, as defined in claim 4, wherein said integrator means is comprised of:
   (a) an operational amplifier having an input thereof connected to said first and second switched capacitor means, for receiving said first and second sampled signals,
   (b) an integrating capacitor connected to an output and said input of the operational amplifier,
   (c) switched feedback capacitor means connected across said integrating capacitor, for receiving said non-overlapping signals and alternately discharging and storing said received sampled signals thereon in response to positive half cycles of said first and second hon-overlapping signals respectively,
   whereby said operational amplifier generates a filtered signal, and
   (d) output transistor switch means for receiving said second clock signal and sampling said filtered signal at said second sampling frequency and generating said decimated filtered output signal in response thereto.

7. A decimating filter, as defined in claim 4, wherein said input signal is a digital signal having a predetermined baudrate, said first sampling frequency is approximately sixteen times said baudrate and said second sampling frequency is approximately eight times said baudrate.

8. A decimating filter, as defined in claim 3, wherein said integrator means is comprised of:
   (a) an operational amplifier having an input thereof connected to said first and second switched capacitor means, for receiving said first and second sampled signals,
   (b) an integrating capacitor connected to an output and said input of the operational amplifier,
   (c) switched feedback capacitor means connected across said integrating capacitor, for receiving said non-overlapping signals and alternately discharging and storing said received sampled signals thereon in response to positive half cycles of said first and second non-overlapping signals respectively,
   whereby said operational amplifier generates a filtered signal, and
   (d) output transistor switch means for receiving said second clock signal and sampling said filtered signal at said second sampling frequency and generating said decimated filtered output signal in response thereto.

9. A decimating filter, as defined in claim 3, wherein said input signal is a digital signal having a predetermined baudrate, said first sampling frequency is approximately sixteen times said baudrate and said second sampling frequency is approximately eight times said baudrate.

10. A decimating filter, as defined in claim 2, wherein said integrator means is comprised of:
   (a) an operational amplifier having an input thereof connected to said first and second switched capacitor means, for receiving said first and second sampled signals,
   (b) an integrating capacitor connected to an output and said input of the operational amplifier,
   (c) switched feedback capacitor means connected across said integrating capacitor, for receiving said non-overlapping signals and alternately discharging and storing said received sampled signals thereon in response to positive half cycles of said first and second non-overlapping signals respectively,
   whereby said operational amplifier generates a filtered signal, and
   (d) output transistor switch means for receiving said second clock signal and sampling said filtered signal at said second sampling frequency and generating said decimated filtered output signal in response thereto.

11. A decimating filter, as defined in claim 2, wherein said input signal is a digital signal having a predetermined baudrate, said first sampling frequency is approximately sixteen times said baudrate and said second sampling frequency is approximately eight times said baudrate.

12. A decimating filter, comprised of:
   (a) first input means for receiving a first input signal,
   (b) second input means for receiving a second input signal including a reduced version of said first input signal,
   (c) means for generating first and second clock signals having first and second sampling frequencies respectively, said first frequency being a multiple of said second frequency,
   (d) first switched-capacitor means for receiving said first clock signal, sampling said first input signal on a first phase of said first clock signal and generating a first sampled signal in response thereto,
   (e) second switched-capacitor means for receiving said first clock signal, sampling said first input signal on an opposite phase of said first clock signal and generating a second sampled signal in response thereto,
   (f) third switched-capacitor means for receiving said first clock signal, sampling said second input signal on said first phase of the first clock signal, and generating a third sampled signal in response thereto,
   (g) fourth switched-capacitor means for receiving said first clock signal, sampling said second input signal on the opposite phase of said first clock signal, and generating a fourth sampled signal in response thereto,
   (h) means for subtracting said third and fourth sampled signals from said first and second sampled signals,
   whereby said reduced versions of the first input signal are substantially cancelled from said second input signal, and
   (i) integrator means for receiving said second clock signal, integrating said subtracted signals, sampling said integrated signals at said second sampling frequency and generating a decimated filtered output signal in response thereto.

13. A decimating filter as defined in claim 12, wherein said first clock signal is comprised of first and second non-overlapping rectangular signals.

14. A decimating filter as defined in claim 13, wherein said first switched-capacitor means is comprised of:
   (a) a first capacitor having first and second terminals,
   (b) first transistor switch means for receiving said non-overlapping signals and alternately connecting said first terminal of the first capacitor between said first input means and ground in response to positive half cycles of said first and second non-overlapping signals respectively, and
   (c) second transistor switch means for receiving said non-overlapping signals and alternately connecting said second terminal of the first capacitor between an input of said integrator means and ground in response to said positive half cycles of the first and second non-overlapping signals respectively.

15. A decimating filter as defined in claim 14, wherein said second switched-capacitor means is comprised of:
   (a) a second capacitor having first and second terminals,
   (b) third transistor switch means for receiving said non-overlapping signals and alternately connecting said first terminal of the second capacitor between ground and said first input means in response to said positive half cycles of the first and second non-overlapping signals respectively, and
   (c) fourth transistor switch means for receiving said non-overlapping signals and alternately connecting said second terminal of the second capacitor between ground and said input of the integrator means in response to said positive half cycles of the first and second non-overlapping clock signals.

16. A decimating filter as defined in claim 15, wherein said third switched-capacitor means is comprised of:
   (a) a third capacitor having first and second terminals, said second terminal being connected to said fourth transistor switch means, and
   (b) fifth transistor switch means for receiving said non-overlapping signals and alternately connecting said first terminal of the third capacitor between said second input means and ground in response to positive half cycles of said first and second non-overlapping signals respectively.

17. A decimating filter as defined in claim 16, wherein said integrator means is comprised of:
   (a) an operational amplifier having an input connected to said means for subtracting, for receiving said subtracted signals,
   (b) an integrating capacitor connected to an output and said input of the operational amplifier,
   (c) switched feedback capacitor means connected across said integrating capacitor, for receiving said non-overlapping signals and alternately discharging, and storing said received summed signals thereon in response to positive half cycles of said first and second non-overlapping signals, respectively,
   whereby said operational amplifier generates a filtered output signal, and (d) output transistor switch means for receiving said second clock signal and sampling said filtered output signal at said second sampling frequency in response thereto, thereby generating said decimated filtered output signal.

18. A decimating filter as defined in claim 14, wherein said fourth switched-capacitor means is comprised of:
   (a) a fourth capacitor having first and second terminals, said second terminal being connected to said second transistor switch means, and
   (b) sixth transistor switch means for receiving said non-overlapping signals and alternately connecting said first terminal of the fourth capacitor between ground and said second input means in response to said positive half cycles of the first and second non-overlapping signals respectively.

19. A decimating filter as defined in claim 18, wherein said first and second capacitors have capacitances equal in value to approximately one-half the capacitance of said third and fourth capacitors.

20. A decimating filter as defined in claim 18, wherein each of said transistor switch means is comprised of a pair of CMOS transmission gates.

21. A decimating filter as defined in claim 18, wherein said integrator means is comprised of:
   (a) an operational amplifier having an input connected to said means for subtracting, for receiving said subtracted signals,
   (b) an integrating capacitor connected to an output and said input of the operational amplifier,
   (c) switched feedback capacitor means connected across said integrating capacitor, for receiving said non-overlapping signals and alternately discharging, and storing said received summed signals thereon in response to positive half cycles of said first and second non-overlapping signals, respectively,
   whereby said operational amplifier generates a filtered output signal, and
   (d) output transistor switch means for receiving said second clock signal and sampling said filtered output signal at said second sampling frequency in response thereto, thereby generating said decimated filtered output signal.

22. A decimating filter as defined in claim 5 wherein said integrator means is comprised of:
   (a) an operational amplifier having an input connected to said means for subtracting, for receiving said subtracted signals,
   (b) an integrating capacitor connected to an output and said input of the operational amplifier,
   (c) switched feedback capacitor means connected across said integrating capacitor, for receiving said non-overlapping signals and alternately discharging, and storing said received summed signals thereon in response to positive half cycles of said first and second non-overlapping signals, respectively,
   whereby said operational amplifier generates a filtered output signal, and
   (d) output transistor switch means for receiving said second clock signal and sampling said filtered output signal at said second sampling frequency in response thereto, thereby generating said decimated filtered output signal.

* * * * *